United States Patent
Peter et al.

(10) Patent No.: US 6,762,521 B2
(45) Date of Patent: Jul. 13, 2004

(54) DRIVE UNIT FOR A FAN IN A VEHICLE

(75) Inventors: Cornelius Peter, Traubenweg (DE);
Johann Von Der Heide, Schramberg (DE); Ega Tschiskale, Stockach (DE);
Daniel Baltrusch, Orsingen-Nenzingen (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 0 days.

(21) Appl. No.: 10/023,778

(22) Filed: Dec. 17, 2001

(65) Prior Publication Data

US 2002/0109426 A1 Aug. 15, 2002

(30) Foreign Application Priority Data

Dec. 20, 2000 (DE) .......................................... 100 63 619

(51) Int. Cl.[7] ................................................ H02K 1/32
(52) U.S. Cl. ........................ 310/89; 310/67 R; 310/61; 310/64; 310/43
(58) Field of Search .............................. 310/89, 90, 71, 310/67 R, DIG. 6, 52–65, 43; 417/423.8

(56) References Cited

U.S. PATENT DOCUMENTS

| | | | | |
|---|---|---|---|---|
| 4,428,719 A | * | 1/1984 | Hayashibara et al. | 417/354 |
| 4,554,473 A | * | 11/1985 | Muller | 310/67 R |
| 4,682,065 A | * | 7/1987 | English et al. | 702/76 |
| 5,334,897 A | * | 8/1994 | Ineson et al. | 310/89 |
| 5,343,104 A | * | 8/1994 | Takahashi et al. | 310/90 |
| 5,574,321 A | * | 11/1996 | Baker | 310/67 R |
| 5,588,814 A | * | 12/1996 | De Filippis et al. | 417/423.7 |
| 5,798,589 A |   | 8/1998 | Ohi et al. | 310/90 |
| 5,898,988 A |   | 5/1999 | Horski | 209/59.6 |
| 5,962,938 A | * | 10/1999 | Bobay et al. | 310/67 R |
| 5,969,445 A | * | 10/1999 | Horiuchi et al. | 310/64 |
| 5,982,064 A | * | 11/1999 | Umeda et al. | 310/90 |
| 6,107,708 A | * | 8/2000 | Yamaguchi et al. | 310/58 |
| 6,121,700 A | * | 9/2000 | Yamaguchi et al. | 310/68 B |
| 6,236,126 B1 | * | 5/2001 | Yagi et al. | 310/51 |
| 6,278,207 B1 | * | 8/2001 | Matsumoto | 310/88 |
| 6,297,572 B1 | * | 10/2001 | Sunaga et al. | 310/68 R |
| 6,333,576 B1 | * | 12/2001 | Ishikawa et al. | 310/85 |

FOREIGN PATENT DOCUMENTS

| | | |
|---|---|---|
| DE | 3614748 C2 | 1/1987 |
| DE | 29521591 U1 | 1/1988 |
| DE | 4234017 A1 | 4/1993 |
| DE | 4141106 A1 | 6/1993 |
| DE | 4418000 C2 | 11/1995 |
| DE | 19521557 A1 | 12/1995 |
| DE | 19727165 A1 | 1/1999 |
| DE | 19757136 A1 | 6/1999 |
| DE | 19812729 A1 | 9/1999 |
| DE | 29914693 U1 | 2/2000 |
| EP | 0310391 A2 | 4/1989 |
| EP | 0784369 A1 | 7/1997 |
| JP | 01092599 A | 4/1989 |

* cited by examiner

*Primary Examiner*—Dang Le
(74) *Attorney, Agent, or Firm*—Tarolli, Sundheim, Covell & Tummino L.L.P.

(57) ABSTRACT

A drive unit for fans in vehicles has a brushless DC motor and an electronic actuation system. The electronic actuation system is surrounded by a housing made of plastics that supports the DC motor. The housing has an integrally molded bearing sleeve for mounting the rotor of the DC motor, which is configured as an external rotor. The upper part of the housing is the only supporting component of the drive unit.

18 Claims, 3 Drawing Sheets

DRIVE UNIT FOR A FAN IN A VEHICLE

The present invention relates to a drive unit for fans in vehicles, comprising a brushless direct current motor and an electronic actuation system.

BACKGROUND OF THE INVENTION

A fan for vehicles with a drive unit that has a brushless direct current motor with an external rotor is already known from U.S. Pat. No. 5,588,814. The drive unit of this fan is integrated into a collecting and distributing box, which surrounds the fan wheel. The external rotor, which is combined with the fan wheel to form a structural unit, is mounted on base parts of the collecting and distributing box. The air sucked in by the fan wheel is directed against the drive unit. A cooling air flow that is derived from the sucked-in air is fed to power semiconductors of the electronic actuation system, the power semiconductors being mounted on a circuit board situated below the drive unit.

SUMMARY OF THE INVENTION

The drive unit according to the invention for a fan in a vehicle is an autonomous assembly that does not require any structural parts on the collecting and distributing box in order to mount the direct current electric motor or to accommodate the electronic actuation system. According to the invention, the electronic actuation system is surrounded by a housing made of plastics that supports the electric motor. Since the drive unit forms an autonomous assembly, it can be combined with all kinds of housing parts and fan wheels to constitute a fan. The housing surrounding the electronic actuation system is installed on the suction side of the fan so that the sucked-in air can be fed through inlet openings in the housing and can be used to cool the power semiconductors of the electronic actuation system as well as the components of the electric motor.

In a preferred embodiment of the drive unit, the housing has an integrally molded bearing sleeve for mounting the rotor of the electric motor, which has an external rotor. The bearing sleeve accommodates the bearings for mounting the journal of the external rotor. It also forms a guide channel for the cooling air flow that is needed for cooling the power semiconductors of the electronic actuation system and that can enter through air inlet openings of the housing, parallel to the air flows between the rotor and the stator of the electric motor resulting from the pressure differential between the suction side and the pressure side of the fan.

According to another advantageous embodiment of the invention, the electronic actuation system has a power part and a control part, which are mounted on separate circuit boards, the circuit board for the power part being made in that a conductor structure stamped out of sheet metal is encapsulated with plastic by means of injection-molding. Therefore, the power part can handle extremely high currents without endangering the sensitive components on the printed circuit board of the control part.

BRIEF DESCRIPTION OF THE DRAWINGS

Additional features and advantages of the invention ensue from the following description of a preferred embodiment and from the appended drawings to which reference is made. The drawings show the following.

DESCRIPTION OF THE PREFERRED EMBODIMENTS

Figure 1:
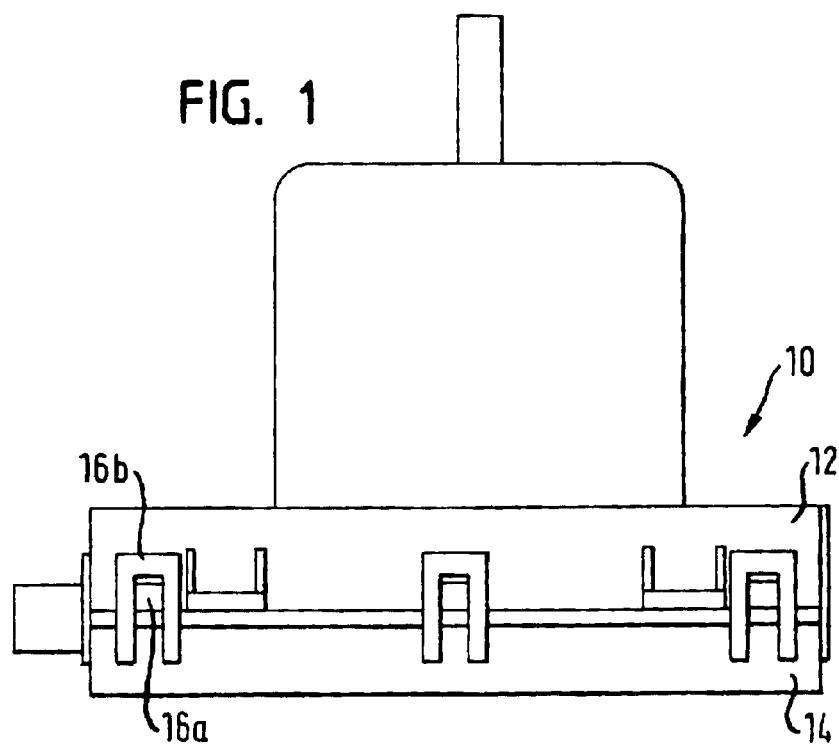
FIG. 1—a schematic side view of a drive unit for fans.
Figure 2:
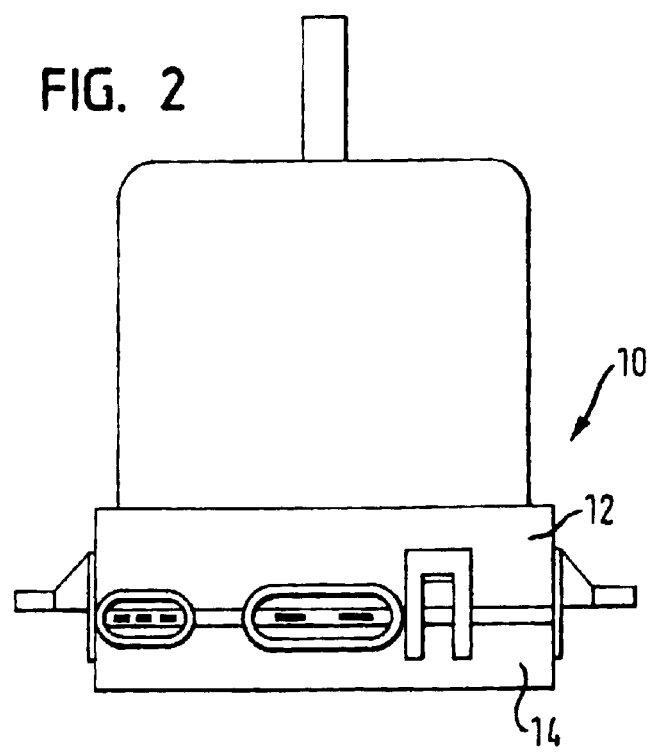
FIG. 2—a frontal view of the drive unit.

With reference to the drawings, a drive unit is shown that has a housing made of plastics as generally designated with the reference numeral 10. The generally parallelepipedal housing 10 consists of an upper part 12 and a lower part 14. The upper part 12 and the lower part 14 are connected to each other by means of latching connection elements 16a on the upper part 12 and 16b on the lower part 14. The upper part 12 has laterally projecting assembly tabs 18 on which the entire drive unit is suspended or attached in a fan housing. The upper part 12 of the housing 10 forms a supporting component.

Figure 4:
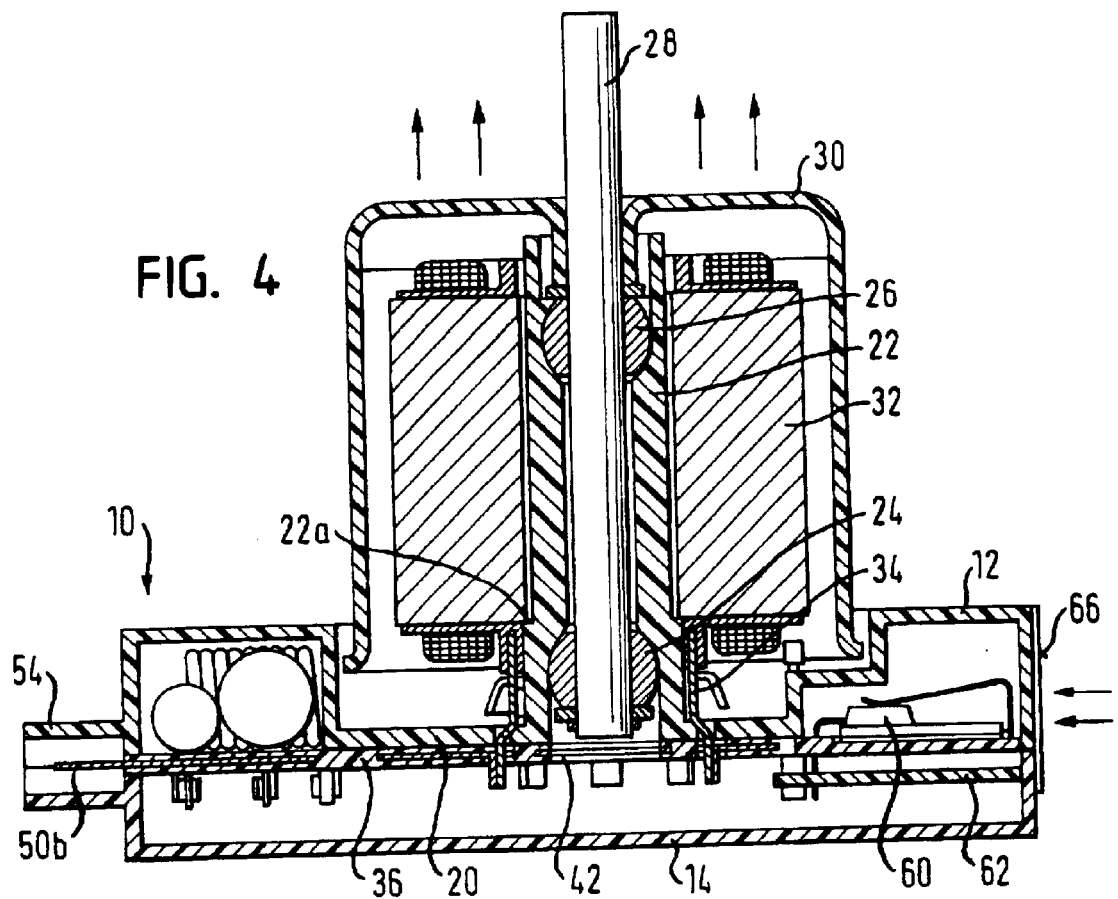
FIG. 4—an axial section of the drive unit.
Figure 3:
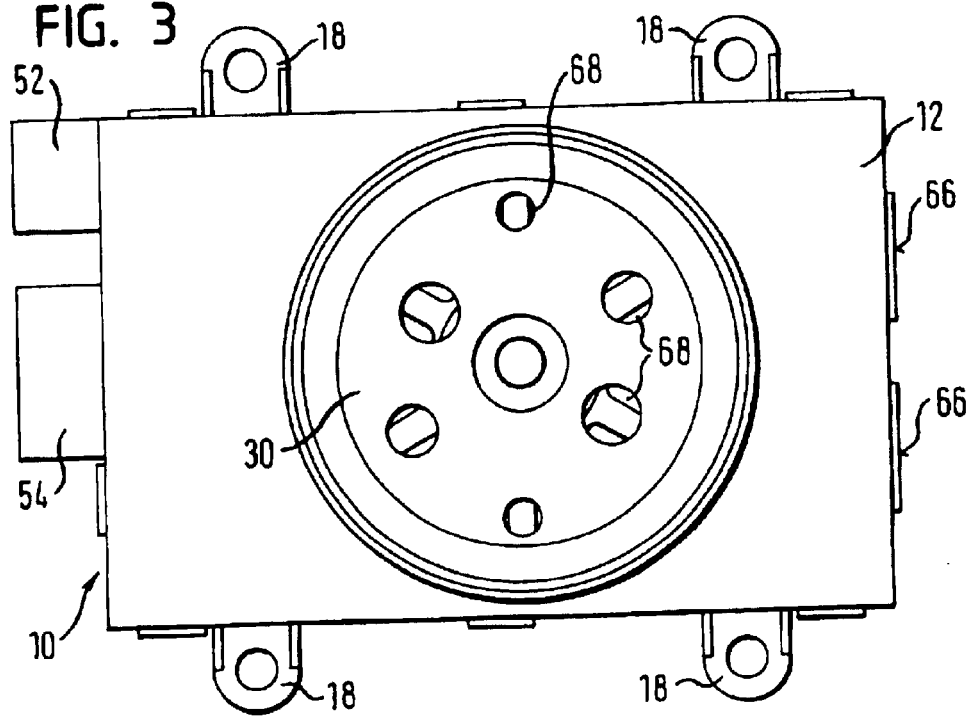
FIG. 3—a top view of the drive unit.

The upper part 12 of the housing 10, as can be seen in FIG. 4, has a generally cylindrical depression 20 at its top. From the bottom of this depression, an integrally molded bearing sleeve 22 projects perpendicularly upwards. Bearings 24, 26 for a bearing shaft 28 are mounted at the axial ends of the bearing sleeve 22. The bearing shaft 28 supports a generally pot-shaped rotor 30, configured as an external rotor, of an electric DC motor whose stator 32 is hollow-cylindrical in shape and is slipped onto the bearing sleeve 22. The axial position of the stator 32 is defined by the fact that its inner circumference bears on a shoulder 22a of the bearing sleeve 22. The electric motor is especially a brushless, four-phase DC motor.

Figure 5:
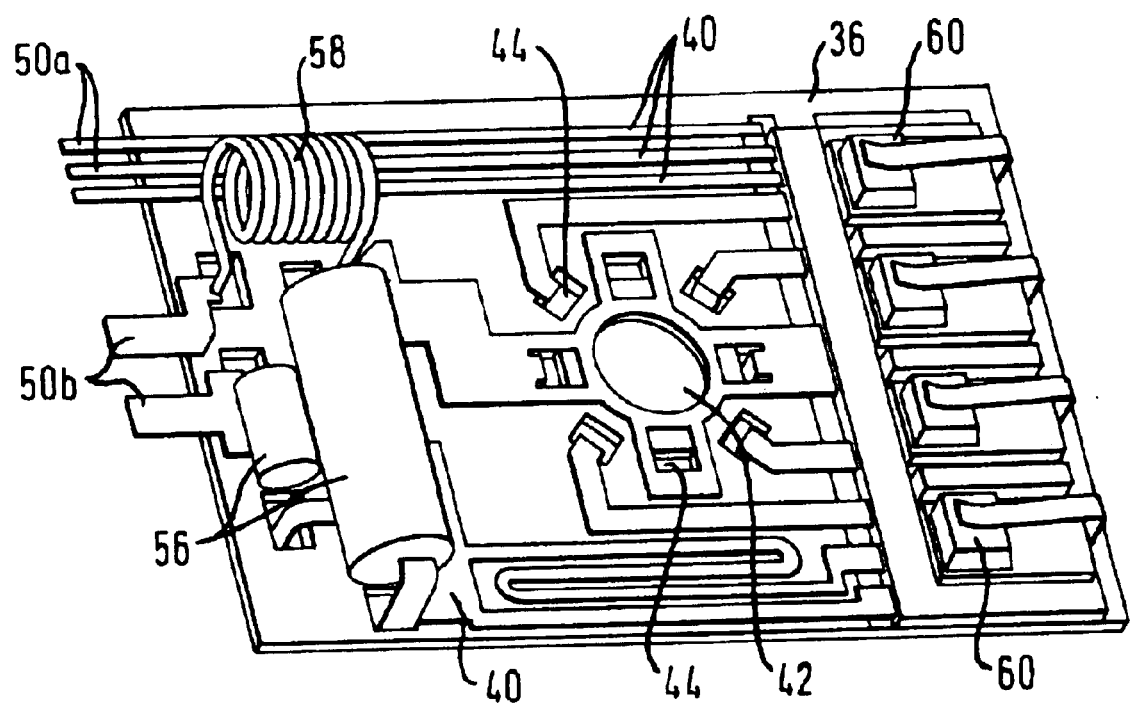
FIG. 5—a perspective illustrative view of a printed circuit board of the drive unit.

From the windings of the stator 32, solid connection tags 34 on the periphery of the bearing sleeve 22 extend along the bottom of the depression 20 of the upper part 12 and through the openings surrounding the bearing sleeve 22 and into the inside of the housing 10. The housing 10 embeds a first circuit board 36 that extends over the entire width of the housing. This first circuit board 36 is a solid conductor structure encapsulated with plastic by means of injection-molding. The solid conductor structure consists of strip-like conductors 40 (FIG. 5) that are stamped out of sheet metal. The circuit board 36 has a circular passage 42 that is arranged coaxially to the bearing sleeve 22. This passage 42 is surrounded by openings 44 the arrangement of which corresponds to the ends of the connection tags 34 of the stator 32 extending into the housing. Due to the four-polar configuration of the electric motor, there are eight such openings 44 with adjacent terminal ends of the conductors 40. The ends of the connection tags 34 are connected at the openings 44 with the corresponding conductor terminal ends by means of soldering.

On a narrow side of the circuit board 36, a few of the conductors 40 extend as contact tags 50a and 50b. The contact tags 50a and 50b project out of the housing 10 at a narrow end face and are surrounded by molded-on plug collars 52, 54. The dimensions of the contact tags 50a are smaller than those of the contact tags 50b and they serve to connect sensor and control lines, whereas the contact tags 50b serve to supply power.

Relatively large-volume filter components such as capacitors 56 and a choke 58 are arranged in the interior space of the housing 10, adjacent to the contact tags 50a and 50b. Four power semiconductors 60 are situated at the opposite end of the circuit board 36. The cooling fins of the power semiconductors 60 bear directly on an exposed metal surface of the conductors 40. The power semiconductors are electrically and thermally in contact with the conductors. The connection leads of the power semiconductors 60 are bent perpendicular with respect to the circuit board 36 and extend through corresponding openings of the circuit board to reach a second, printed circuit board 62 that is situated parallel below the first circuit board 36. The control part of the electronic actuation system of the direct current motor is mounted on this printed circuit board 62, whereas the power part of the electronic actuation system is mounted on the first circuit board 36.

Air inlet openings 66 are arranged on the narrow side of the housing 10 opposite from the contact tags 50*a*, 50*b*, next to the power semiconductors 60. Furthermore, air outlet openings 68 are provided in the end face of the pot-shaped rotor 30 remote from the air inlet openings 66. The described drive unit is arranged in the housing of the fan in such a way that the air inlet openings 66 are situated on the suction side of the fan The fan wheel of the fan is mounted and secured directly on the end of the bearing shaft 28 extending outward from the rotor 30. In operation, since the drive unit is located on the suction side of the fan, an air flow is fed through the air inlet openings 66 of the housing 10 into its inside and guided past the power semiconductors 60. The air then flows through the bearing sleeve 22, which also functions as a guide channel, to the end face of the rotor 30 and escapes through its openings 68. The cooling air flow cools the power electronics as well as the windings of the stator 32.

The described drive unit is quite compact and yet powerful, especially because of the good cooling of all of its thermally stressed components and because of its mechanically sturdy structure. An especially high rigidity of the assembly results from the fact that the circuit board 36 lies inside the housing 10 on the bottom of its upper part 12, thereby forming an axial buttress for the stator 32. Since no supporting components are needed, except for the upper part 12 of the housing 10, the mechanical construction is very simple and yet sturdy. During assembly, the various components of the drive unit are assembled essentially in the axial direction of the rotor 30 and then attached to each other, resulting in a simplified assembly that can be carried out automatically.

What is claimed is:

1. A drive unit for a fan in a vehicle, said drive unit comprising a brushless DC electric motor with a rotor and a stator, an electronic actuation system, and a housing molded of plastics, said electronic actuation system being surrounded by said housing, said housing supporting said electric motor, said housing having air inlet openings for cooling of electronic components of said electronic actuation system and for cooling components of said electric motor, said rotor being generally pot-shaped and having air outlet openings on an end face of said rotor remote from said air inlet openings of said housing, said housing having a bearing sleeve integrally molded with said housing, said rotor of said electric motor being mounted on said bearing sleeve, said bearing sleeve having a guide channel for directing cooling air that enters said housing through said air inlet openings of said housing toward said outlet openings of said rotor, said electronic actuation system having a power part and a control part, said power part and said control part being mounted on separate circuit boards, said air inlet openings of said housing being provided next to power semiconductors of said power part.

2. The drive unit according to claim 1, wherein said housing is assembled of two separate and distinct housing parts, one of said housing parts comprising an upper housing part including said bearing sleeve and supporting said electric motor, the other of said housing parts comprising a lower housing part that faces said upper housing part and closes an open main side of said upper housing part, said upper housing part having a generally cylindrical depression, said cylindrical depression surrounding said bearing sleeve, a circumferential edge of said rotor extending into said cylindrical depression of said upper housing part.

3. The drive unit according to claim 2, wherein said upper housing part has laterally projecting assembly tabs.

4. The drive unit according to claim 2, wherein said lower housing part and said upper housing part are connected with each other by latching means.

5. The drive unit according to claim 2, wherein said rotor is generally pot-shaped and has an end face attached to a bearing shaft.

6. The drive unit according to claim 5, wherein said bearing shaft is rotatably mounted in said bearing sleeve by means of bearings placed into said bearing sleeve.

7. The drive unit according to claim 1, wherein said bearing sleeve is surrounded by a hollow-cylindrical stator of said electric motor.

8. The drive unit according to claim 7, wherein said bearing sleeve has a shoulder on which an inner circumferential edge of said stator bears.

9. The drive unit according to claim 2, wherein said stator is provided with axially projecting connection tags that extend through openings of said cylindrical depression of said upper housing part and that may be connected to a printed circuit board arranged in an interior of said housing.

10. The drive unit according to claim 1, wherein a circuit board of said power part is a conductor structure stamped out of sheet metal encapsulated with plastic by means of injection-molding.

11. The drive unit according to claim 10, wherein said conductor structure of said power part has contact tags that project from an edge of said circuit board.

12. The drive unit according to claim 11, wherein said contact tags project from an outside surface of said housing and are surrounded by at least one plug collar molded with said housing.

13. The drive unit according to claim 10, wherein said circuit board of said power part has connection openings arranged in a circle, said connection tags of said stator being adapted to be inserted into said connection openings, said conductor structure of said power part having terminal parts adjacent to said connection openings.

14. The drive unit according to claim 10, wherein said circuit board of said power part has exposed metal surfaces of said conductor structure thermally contacted by said power semiconductors of said electronic actuation system.

15. The drive unit according to claim 14, wherein said circuit board of said control part is spaced from and parallel to said circuit board of said power part, said power semiconductors having bent connection tags that extend through openings in said circuit board of said power part and are connected to said circuit board of said control part.

16. The drive unit according to claim 1, wherein said housing is arranged on a suction side of said fan.

17. The drive unit according to claim 1, wherein said rotor is an external rotor that is generally pot-shaped and has an end face attached to a bearing shaft.

18. The drive unit according to claim 17, wherein said bearing shaft is rotatably mounted in said bearing sleeve by means of bearings placed into said bearing sleeve.

* * * * *

UNITED STATES PATENT AND TRADEMARK OFFICE
CERTIFICATE OF CORRECTION

PATENT NO.    : 6,762,521 B2
DATED         : July 13, 2004
INVENTOR(S)   : Cornelius Peter et al.

It is certified that error appears in the above-identified patent and that said Letters Patent is hereby corrected as shown below:

Title page,
Item [75], Inventor, "Cornelius Peter, Traubenweg (DE);", should be -- Cornelius Peter, Buhl (DE); --.

Signed and Sealed this

Fifteenth Day of February, 2005

JON W. DUDAS
*Director of the United States Patent and Trademark Office*